United States Patent
Biggs et al.

(10) Patent No.: US 9,966,275 B2
(45) Date of Patent: May 8, 2018

(54) METHODS OF TREATING NITRIDE FILMS

(71) Applicant: Applied Materials, Inc., Santa Clara, CA (US)

(72) Inventors: Brent Biggs, San Jose, CA (US); Avgerinos V. Gelatos, Scotts Valley, CA (US); Takashi Kuratomi, San Jose, CA (US); Mark H. Lee, Mountain View, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days. days.

(21) Appl. No.: 15/381,779

(22) Filed: Dec. 16, 2016

(65) Prior Publication Data

US 2017/0178927 A1 Jun. 22, 2017

Related U.S. Application Data

(60) Provisional application No. 62/269,038, filed on Dec. 17, 2015.

(51) Int. Cl.
 *H01L 21/3205* (2006.01)

(52) U.S. Cl.
 CPC .............. *H01L 21/32053* (2013.01)

(58) Field of Classification Search
 None
 See application file for complete search history.

(56) References Cited

U.S. PATENT DOCUMENTS

| | | |
|---|---|---|
| 6,335,277 B2 | 1/2002 | Ohto |
| 8,148,275 B2 | 4/2012 | Fukuchi et al. |
| 9,337,300 B2 | 5/2016 | Toshiba |
| 2002/0106908 A1 | 8/2002 | Cohen et al. |
| 2003/0181031 A1* | 9/2003 | Kojima ............. H01L 21/31116 438/627 |
| 2004/0147127 A1* | 7/2004 | Noguchi ........... H01L 21/02074 438/690 |
| 2007/0116887 A1 | 5/2007 | Faguet |
| 2009/0202807 A1 | 8/2009 | Takeyama et al. |
| 2010/0155859 A1 | 6/2010 | Raaijmakers |
| 2011/0212274 A1* | 9/2011 | Selsley ............... C23C 14/5826 427/540 |
| 2012/0228642 A1 | 9/2012 | Aube et al. |

FOREIGN PATENT DOCUMENTS

JP 2009521594 A 6/2009

OTHER PUBLICATIONS

PCT International Search Report and Written Opinion in PCT/US2016/067202 dated May 30, 2017, 12 pages.

* cited by examiner

*Primary Examiner* — Asok K Sarkar
(74) *Attorney, Agent, or Firm* — Servilla Whitney LLC

(57) ABSTRACT

Methods for reducing oxygen content in an oxidized annealed metal nitride film comprising exposing the film to a plasma.

19 Claims, 3 Drawing Sheets

METHODS OF TREATING NITRIDE FILMS

CROSS-REFERENCE TO RELATED APPLICATIONS

This application claims priority to U.S. Provisional Application No. 62/269,038, filed Dec. 17, 2015, the entire disclosure of which is hereby incorporated by reference herein.

FIELD

Embodiments of the present disclosure generally relate to methods of treating nitride films. More particularly, the disclosure relates to methods for treating oxidized annealed metal films to reduce oxygen.

BACKGROUND

For metal silicide (e.g., titanium silicide) integration schemes, metal (e.g., titanium) and/or metal nitride (e.g., titanium nitride) films are deposited on clean substrate (e.g., silicon) surfaces and annealed to form metal silicide (e.g., TiSi) films. After deposition of a metal film, metal silicide film, and/or metal nitride film, an air break or oxygen exposure may occur prior to annealing. The metal nitride film becomes oxidized and the contact resistance increases. There is a need for methods to reduce oxygen in post-annealed oxidized metal nitride films. There is also a need for methods of reducing resistivity of oxidized annealed metal nitride films to improve contact resistance.

SUMMARY

One or more embodiments of the disclosure are directed to methods comprising exposing an annealed metal nitride film having an oxygen content to a plasma to reduce an oxygen content of the metal nitride film.

Additional embodiments of the disclosure are directed to methods comprising annealing a substrate having a metal nitride film thereon. The metal nitride film is allowed to become oxidized to have an oxygen content greater than or equal to about 7 atomic %. The metal nitride film is exposed to a plasma comprising one or more of $N_2$, $H_2$ or $NH_3$ to reduce the oxygen content to less than or equal to about 5.5 atomic %.

Further embodiments of the disclosure are directed to methods comprising providing a silicon substrate with a metal nitride thereon. The metal nitride comprises one or more of tantalum, titanium or tungsten. The substrate is annealed to create a metal silicide nitride film. The metal silicide nitride film is allowed to oxidize to form an oxidized annealed metal silicide nitride film. The oxidized annealed metal silicide nitride film has an oxygen content greater than or equal to about 8 atomic %. The oxidized annealed metal silicide nitride film is exposed to a plasma comprising one or more of $N_2$, $H_2$ or $NH_3$ to form a treated metal silicide nitride film with an oxygen content less than or equal to about 5.5 atomic %. A cobalt film is formed on the treated metal silicide nitride film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure are directed to apparatus and methods for preheating and/or post-cooling a batch of wafers. As used in this specification and the appended claims, the terms "wafer", "substrate" and the like are used interchangeably. In some embodiments, the wafer is a rigid, discrete substrate, for example, a 200 mm or 300 mm silicon wafer. Suitable substrates include, but are not limited to, silicon, silicon oxide, strained silicon, silicon on insulator (SOI), carbon doped silicon oxides, silicon nitride, doped silicon, germanium, gallium arsenide, glass, sapphire, silicon-phosphorous, silicon-germanium and any other materials such as metals, metal nitrides, metal alloys, and other conductive materials, depending on the application.

Figure 1:
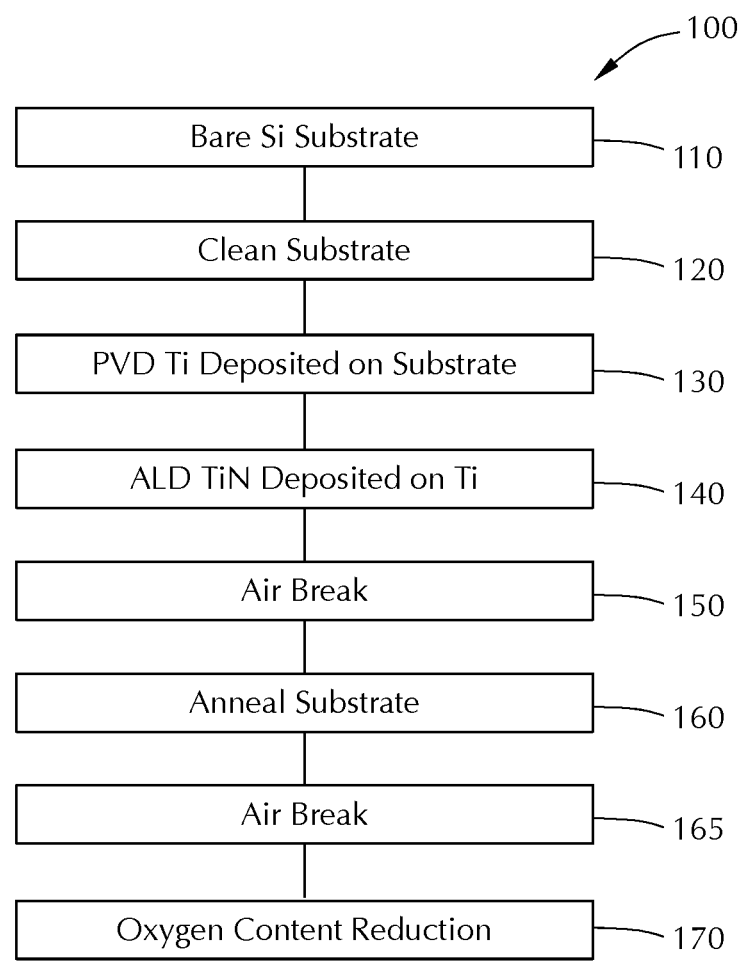
FIG. 1 is schematic of a process sequence in accordance with one or more embodiment of the disclosure.

FIG. 1 illustrates an exemplary process chain 100 in accordance with one or more embodiment of the disclosure. The process chain 100 shown includes reference to silicon substrates, titanium and titanium nitride films; however, those skilled in the art will understand that these are merely exemplary materials and that the disclosure is not limited to the exemplary materials. FIGS. 2A through 2F show a representation of a substrate surface processed according to process chain 100. The relative dimensions of the surfaces and films are not to scale and should not be taken as limiting the disclosure.

With reference to FIGS. 1 and 2A through 2F, a bare substrate 210 is provided in step 110. A bare substrate may include, for example, a native oxide 220 thereon. It is known that a silicon substrate surface may oxidize over time with exposure to air resulting in the native oxide 220. The bare substrate 210 is positioned within a processing chamber, for example, a Chemical Vapor Deposition (CVD), Physical Vapor Deposition (PVD) or Rapid Thermal Processing (RTP) chamber.

Figure 2A:
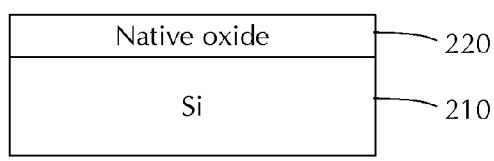
FIGS. 2A through 2G show schematic cross-sectional views of the process of FIG. 1.
Figure 2B:
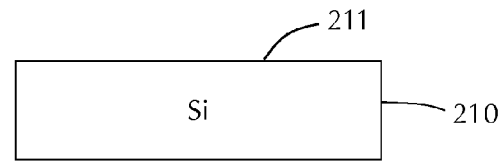

In step 120, as shown in FIG. 2B, the substrate 210 is cleaned to remove the native oxide 220, leaving a clean substrate surface 211. The native oxide can be removed by any suitable technique including, but not limited to, a dry etch process known as a Siconi™ etch. A Siconi™ etch is a remote plasma assisted dry etch process which involves the simultaneous exposure of a substrate to $H_2$, $NF_3$ and $NH_3$ plasma. Remote plasma excitation of the hydrogen and fluorine species allows plasma-damage-free substrate processing. The Siconi™ etch is largely conformal and selective towards silicon oxide layers but does not readily etch silicon regardless of whether the silicon is amorphous, crystalline or polycrystalline.

Figure 2C:
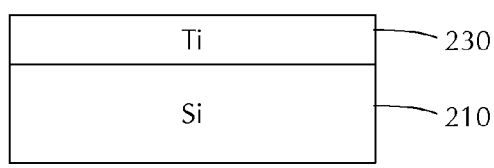

In step 130, a metal film 230 is deposited on the clean substrate surface 211. The metal film 230 shown in FIG. 2C is a titanium film; however, those skilled in the art will understand that other metal films can be deposited. In some embodiments, the metal film comprises one or more of titanium, tantalum, Co, Ni, Ni(Pt), and/or tungsten.

The metal film 230 can be deposited by any suitable technique including, but not limited to, PVD, CVD and ALD processes. The thickness of the metal film 230 can be in the range of about 20 Å to about 400 Å, or in the range of about 30 Å to about 300 Å, or in the range of about 40 Å to about 250 Å, or in the range of about 50 Å to about 200 Å, or about 100 Å. In some embodiments, a titanium film having a thickness of about 100 Å is deposited by PVD.

Figure 2D:
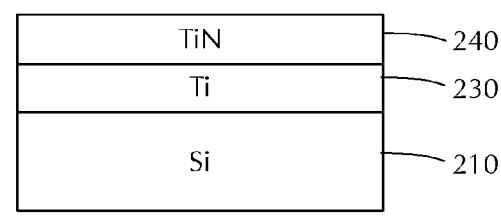

In step 140, a metal nitride film 240 is deposited on the metal film 230. The metal nitride film 240 shown in FIG. 2D is a titanium nitride film; however, those skilled in the art will understand that other films can be deposited. In some embodiments, the metal nitride film 240 comprises one or more of titanium nitride, tantalum nitride and/or tungsten nitride.

The metal nitride film 240 can be deposited by any suitable technique including, but not limited to, PVD, CVD and ALD processes. The thickness of the metal nitride film 240 can be in the range of about 10 Å to about 100 Å, or in the range of about 15 Å to about 90 Å, or in the range of about 20 Å to about 80 Å, or in the range of about 25 Å to about 70 Å, or in the range of about 30 Å to about 60 Å, or in the range of about 35 Å to about 50 Å, or about 40 Å. In some embodiments, a titanium nitride film having a thickness of about 40 Å is deposited by atomic layer deposition.

After deposition of the metal nitride film, the substrate 210 may be transferred out from the processing chamber and subjected to an air break 150. During the air break 150, the surface 246 of the metal nitride film 240 is exposed to oxygen and becomes an oxidized metal nitride film 245.

In step 160, the substrate 210 is positioned in a Rapid Thermal Processing (RTP) or Rapid Thermal Annealing (RTA) chamber or DSA (Dynamic Thermal Anneal) to form Titanium silicide (metal silicide) layer 231. The substrate 210 is annealed resulting in further oxidation of the oxidized metal nitride film 245. The annealing process can occur using any suitable temperature, gas and time parameters. In some embodiments, annealing occurs in a $N_2$ environment at a temperature in the range of about 500° C. to about 600° C.

Figure 2E:
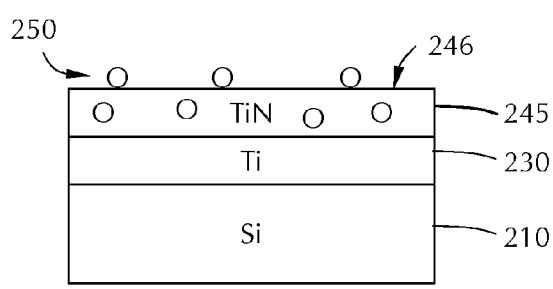
Figure 2F:
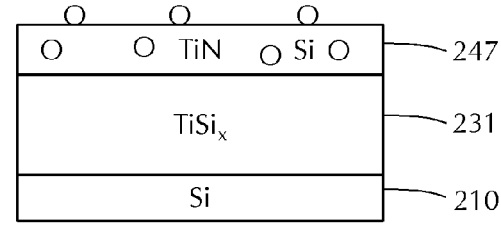

During annealing of the substrate 210 to form the metal silicide layer 231, silicon atoms can migrate into the oxidized metal nitride film 245 to form a metal silicide nitride film 247, as shown in FIG. 2F.

As shown in FIG. 2E, oxygen atoms may form an oxide film 250 on the surface 246 of the metal nitride film 245 and may penetrate the metal nitride film 245. The penetration depth of the oxygen atoms will depend on various factors including, but not limited to, temperature and exposure time. The oxygen atoms may have a higher concentration near the surface 246 of the oxidized metal nitride film 245, as shown in FIG. 2E. In some embodiments, the oxygen atoms are uniformly dispersed throughout the oxidized metal nitride film 245. In some embodiments, at 165, the substrate is removed from vacuum after annealing, providing an air break in the process.

Figure 2G:
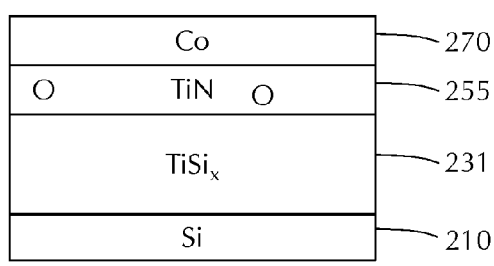

The inventors have found that exposing the oxidized metal silicide nitride film 247 to a plasma can reduce the oxygen content of the film. In step 170, the substrate 210 is positioned within a processing chamber for plasma exposure and oxygen content reduction. A reduced oxygen content metal nitride film is shown in FIG. 2G.

Figure 3:
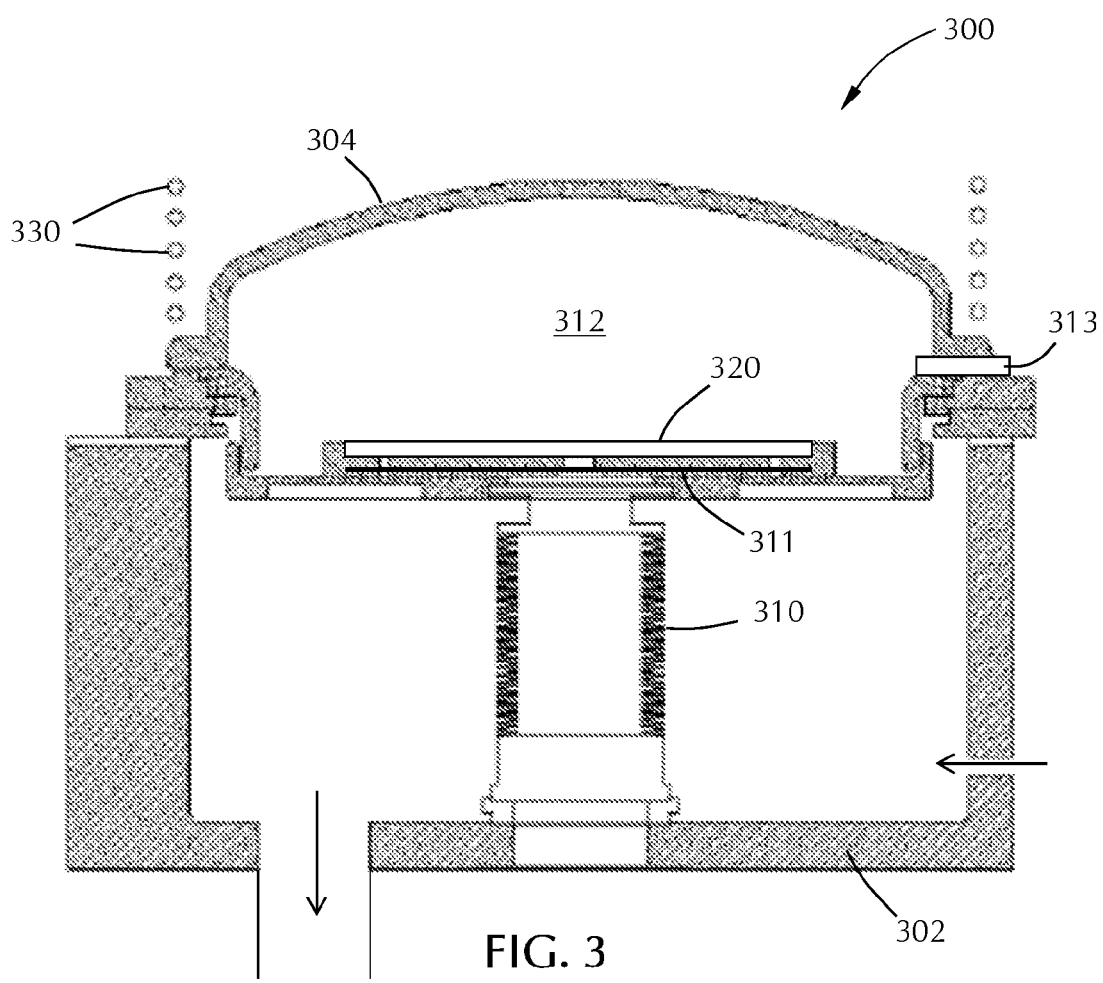
FIG. 3 is a schematic representation of a plasma processing chamber for use with one or more embodiment of the disclosure.

FIG. 3 shows a schematic cross-sectional view of a processing chamber 300 that can be used for the plasma exposure or other processes. The chamber 300 comprises a body 302 with a lid 304. A pedestal 310 within the body 302 supports the substrate 320 for processing. The lid 304 and pedestal 310 form a reaction volume 312 above the substrate 320. A gas can be flowed into the reaction volume 312 through inlet 313. A plasma can be generated in the reaction volume 312 by RF power applied to coils 330 around the lid 304. A bias power can be applied through the pedestal 310 by applying RF power an electrode 311 in the pedestal 310. Without being bound by any particular theory of operation, it is believed that the coil power generates the plasma within the reaction volume 312 and that the bias power creates a driving force that attracts the ionized species in the plasma toward the substrate 320 surface.

An oxidized metal silicide nitride film 247, as used herein, means that the oxygen content of the metal nitride film is greater than or equal to about 7 atomic %. In some embodiments, an oxidized film means that the oxygen content of the film is greater than or equal to about 7.5 atomic %, 8 atomic percent or 8.5 atomic percent. The oxygen content can be measured by any suitable technique including, but not limited to, x-ray photoelectron spectroscopy (XPS).

The oxidized metal silicide nitride film 247 is exposed to a plasma comprising one or more of $N_2$, $H_2$ or $NH_3$. In some embodiments, the plasma is substantially pure. As used in this specification and the appended claims, the term "substantially pure" means that the reactive species in the plasma is greater than or equal to about 90%, 95% or 98% of the stated species on an atomic basis. For example, a substantially pure $N_2$ plasma would have at least about 90% ionized nitrogen atoms relative to the total amount of ionized atoms. In some embodiments, the plasma comprises a mixture of nitrogen and hydrogen.

It has been found that such exposure can reduce the oxygen content of the metal nitride film. As used herein, a reduced oxygen content means that the oxygen content was reduced from the concentration of the oxidized metal nitride film to have an oxygen content less than or equal to about 5.5 atomic %, or 5.25 atomic % or 5 atomic %.

In some embodiments, exposure to the plasma occurs at a substrate temperature in the range of about room temperature to about 550° C. In one or more embodiments, the plasma exposure occurs at a substrate temperature in the range of about 200° C. to about 450° C., or about 250° C. to about 400° C. In some embodiments, the plasma exposure occurs at a substrate temperature greater than about 150° C., 175° C., 200° C. or 250° C. In one or more embodiment, the plasma exposure occurs at a substrate temperature of about 200° C. In some embodiments, the plasma exposure occurs at room temperature. The temperature of the substrate can be increased before entry into the plasma processing chamber or in the plasma processing chamber. In some embodiments, the substrate is heated to a predetermined temperature in a degas chamber and transferred to a plasma processing chamber to plasma exposure. The transfer from the degas chamber to the plasma processing chamber can be done without an air break.

In some embodiments, the substrate is heated in a degas chamber to a temperature of about 400° C. and moved in-situ to a plasma processing chamber for processing. It has been found that higher temperatures improve the contact resistance and adhesion of subsequent metal films.

The bias power applied to the substrate or pedestal can be in the range of about 1 watt to about 500 watts. In some embodiments, the bias power is in the range of about 25 watts to about 400 watts, or in the range of about 50 watts to about 250 watts, or in the range of about 100 watts to about 200 watts, or about 150 watts.

The coil power can be in the range of about 300 watts to about 1500 watts. In some embodiments, the coil power is in the range of about 400 watts to about 1400 watts, or in the range of about 500 watts to about 1300 watts, or in the range of about 600 watts to about 1200 watts, or in the range of about 700 watts to about 1100 watts, or in the range of about 800 watts to about 1000 watts, or about 900 watts.

The pressure during plasma exposure can be in the range of about 1 mTorr to about 100 mTorr. In some embodiments, the pressure during plasma exposure is about 2 mTorr. In some embodiments, the pressure during plasma exposure is less than or equal to about 80 mTorr, or 60 mTorr, or 40 mTorr or 20 mTorr.

Exposure to the plasma can occur for a time in the range of about 15 seconds to about 90 seconds. In some embodiments, plasma exposure occurs for a time in the range of about 30 seconds to about 75 seconds, or about 45 seconds to about 70 seconds, or about 60 seconds. In some embodiments, plasma exposure occurs for greater than or equal to about 10 seconds, 20 seconds, 30 seconds, 40 seconds or 50 seconds. In some embodiments, plasma exposure occurs for less than or equal to about 120 seconds, or 110 seconds, or 100 seconds, or 90 seconds, or 80 seconds, or 70 seconds.

In some embodiments, after plasma exposure is used to reduce the oxygen content of the metal nitride film 255, a metal film 270 is deposited on the metal nitride film 255 by in-situ process. FIG. 2G shows a cobalt film deposited on a TiN film that has a lower oxygen content than before plasma exposure. Those skilled in the art will understand that other metals can be deposited and the disclosure is not limited to cobalt deposition. For example, in some embodiments, the metal film 270 comprises tungsten.

EXAMPLES

Example A

A bare silicon substrate was exposed to a Siconi™ treatment to remove about 50 Å of material from the surface. About 100 Å of Ti was deposited by PVD onto the surface. About 40 Å of TiN was deposited by ALD onto the Ti film.

Example B

A sample was prepared as in Example A and then subjected to rapid thermal processing at about 550° C. for about 30 seconds in an $N_2$ atmosphere.

Examples C-E

Samples were prepared as in Example B. The samples were degassed at 200° C. and exposed to a plasma of $H_2$, $NH_3$ or $N_2$ with a bias power of about 150 watts, a coil power of about 900 watts, a pressure of about 2 mTorr for about 60 seconds.

The oxygen content of the samples was determined by XPS. Results are collected in Table 1.

TABLE 1

| Sample | Description | % Oxygen |
|---|---|---|
| A | TiN as deposited | 3.91 |
| B | annealed | 8.81 |
| C | $NH_3$ plasma | 5.36 |
| D | $N_2$ plasma | 4.79 |
| E | $H_2$ plasma | 5.19 |

It was also observed that the hydrogen plasma caused a reduction in nitrogen content in the film.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

While the foregoing is directed to embodiments of the present disclosure, other and further embodiments of the disclosure may be devised without departing from the basic scope thereof, and the scope thereof is determined by the claims that follow.

What is claimed is:

1. A method comprising exposing an annealed metal nitride film having an oxygen content to a plasma at a temperature in the range of about 200° C. to about 450° C. to reduce the oxygen content of the metal nitride film.

2. The method of claim 1, wherein the metal nitride film comprises one or more of titanium, tantalum and tungsten.

3. The method of claim 2, wherein the metal nitride film comprises a metal silicide nitride.

4. The method of claim 1, wherein the metal nitride film has an oxygen content greater than or equal to about 7 atomic %.

5. The method of claim 4, wherein exposure to the plasma reduces the oxygen content to less than or equal to about 5.5 atomic %.

6. The method of claim 1, wherein the plasma comprises one or more of $N_2$, $H_2$ or $NH_3$.

7. The method of claim 6, wherein the plasma is substantially pure.

8. The method of claim 1, further comprising depositing a Co film on top of the metal nitride film after exposure to the plasma.

9. The method of claim 1, wherein the plasma is generated with a bias power and a coil power.

10. The method of claim 9, wherein the bias power is in the range of about 1 watt to about 300 watts.

11. The method of claim 9, wherein the coil power is in the range of about 300 watts to about 1500 watts.

12. The method of claim 1, wherein exposure to the plasma occurs at a pressure in the range of about 1 mTorr to about 100 mTorr.

13. The method of claim 1, wherein exposure to the plasma occurs for a time in the range of about 15 seconds to about 90 seconds.

14. A method comprising:
annealing a substrate having a metal nitride film thereon at a temperature in the range of about 500° C. to about 600° C.;

allowing the metal nitride film to become oxidized to have an oxygen content greater than or equal to about 7 atomic %; and exposing the oxidized metal nitride film to a plasma comprising one or more of $N_2$, $H_2$ or $NH_3$ to reduce the oxygen content to less than or equal to about 5.5 atomic %.

15. The method of claim 14, wherein annealing the film forms a metal silicide nitride film.

16. The method of claim 14, further comprising forming a cobalt film on the metal nitride film after exposure to the plasma.

17. The method of claim 14, wherein the metal nitride film comprises one or more of Ta, Ti or W.

18. The method of claim 14, wherein the plasma is substantially pure.

19. A method comprising:

providing a silicon substrate with a metal nitride thereon, the metal nitride comprising one or more of tantalum, titanium or tungsten;

annealing the substrate at a temperature in the range of about 500° C. to about 600° C. to create a metal silicide nitride film;

allowing the metal silicide nitride film to oxidize to form an oxidized annealed metal silicide nitride film, the oxidized annealed metal silicide nitride film having an oxygen content greater than or equal to about 8 atomic %;

exposing the oxidized annealed metal silicide nitride film to a plasma comprising one or more of $N_2$, $H_2$ or $NH_3$ to form a treated metal silicide nitride film with an oxygen content less than or equal to about 5.5 atomic %; and forming a cobalt film on the treated metal silicide nitride film.

* * * * *